(12) United States Patent
Brown (10) Patent No.: US 8,143,111 B2
(45) Date of Patent: Mar. 27, 2012

(54) SYSTEM AND METHOD FOR CONFIGURING AN INTEGRATED CIRCUIT

(75) Inventor: Andrew S. Brown, Berkeley, CA (US)

(73) Assignee: ATI Technologies, Inc., Markham, Ontario (CA)

( * ) Notice: Subject to any disclaimer, the term of this patent is extended or adjusted under 35 U.S.C. 154(b) by 357 days.

(21) Appl. No.: 11/273,909

(22) Filed: Nov. 14, 2005

(65) Prior Publication Data

US 2006/0120185 A1 Jun. 8, 2006

Related U.S. Application Data

(60) Provisional application No. 60/627,673, filed on Nov. 12, 2004, provisional application No. 60/627,766, filed on Nov. 12, 2004.

(51) Int. Cl.
*H01L 21/82* (2006.01)

(52) U.S. Cl. ......................... 438/132; 438/467

(58) Field of Classification Search .................. 438/132, 438/467; 257/173, 529, 665, 910
See application file for complete search history.

(56) References Cited

U.S. PATENT DOCUMENTS

| | | | |
|---|---|---|---|
| 5,778,237 A | 7/1998 | Yamamoto et al. | |
| 6,005,447 A | 12/1999 | Huang | |
| 6,118,306 A | 9/2000 | Orton et al. | |
| 6,161,188 A | 12/2000 | Gaskins et al. | |
| 6,353,921 B1 * | 3/2002 | Law et al. | 257/210 |
| 6,385,735 B1 | 5/2002 | Wilson et al. | |
| 6,429,029 B1 * | 8/2002 | Eldridge et al. | 438/14 |
| 6,434,632 B1 | 8/2002 | Hall | |
| 6,633,993 B2 | 10/2003 | Wilson et al. | |
| 6,727,533 B2 * | 4/2004 | Matsuzaki et al. | 257/266 |
| 6,831,294 B1 * | 12/2004 | Nishimura et al. | 257/48 |
| 6,867,441 B1 * | 3/2005 | Yang et al. | 257/209 |
| 6,939,747 B1 * | 9/2005 | Lin | 438/130 |
| 7,046,097 B2 | 5/2006 | Kappes et al. | |
| 7,085,706 B1 | 8/2006 | McGettigan et al. | |
| 7,312,109 B2 * | 12/2007 | Madurawe | 438/138 |
| 7,372,162 B2 * | 5/2008 | Lin | 257/773 |
| 7,402,443 B1 * | 7/2008 | Pang et al. | 438/14 |
| 7,550,763 B2 * | 6/2009 | Nishimura et al. | 257/48 |
| 7,638,369 B2 * | 12/2009 | Sakoh et al. | 438/132 |
| 7,910,960 B2 * | 3/2011 | Nishimura et al. | 257/209 |
| 2001/0013633 A1 * | 8/2001 | Camera et al. | 257/536 |
| 2002/0087896 A1 | 7/2002 | Cline et al. | |
| 2002/0158271 A1 * | 10/2002 | Kouchi et al. | 257/200 |
| 2003/0200520 A1 * | 10/2003 | Huggins et al. | 716/16 |
| 2004/0129952 A1 | 7/2004 | Griesmer et al. | |
| 2004/0188718 A1 * | 9/2004 | Matsuzaki | 257/200 |

(Continued)

FOREIGN PATENT DOCUMENTS

DE 10254076 A1 2/2004

*Primary Examiner* — N. Drew Richards
*Assistant Examiner* — Grant Withers
(74) *Attorney, Agent, or Firm* — Volpe and Koenigm P.C (57) ABSTRACT

A system and method for configuring an integrated circuit. Embodiments include a method for manufacturing an integrated circuit (IC), comprising associating configuration items of the integrated circuit with at least one fuse of at least one type of fuse, wherein a fuse comprises a bit field and a physical fuse, and configuring the integrated circuit by setting the at least one fuse to a value, comprising logically combining multiple fuse values to determine a particular configuration, wherein at least one of the fuse values is not alterable after manufacture of the IC.

9 Claims, 9 Drawing Sheets

U.S. PATENT DOCUMENTS

| | | |
|---|---|---|
| 2004/0222817 A1 | 11/2004 | Madurawe |
| 2005/0041507 A1 | 2/2005 | Otsuka |
| 2005/0181546 A1* | 8/2005 | Madurawe .................... 438/132 |
| 2008/0142847 A1* | 6/2008 | Matsuzaki et al. ............ 257/209 |
| 2010/0038625 A1* | 2/2010 | Bertin ............................... 257/9 |
| 2010/0078723 A1* | 4/2010 | Bertin et al. ................. 257/350 |

* cited by examiner

| Name | Range | Function | Default Behavior (no fuses cut) |
|---|---|---|---|
| Max pipes | 1:0 | Maximum number of raster pipes:<br>00 = 4<br>01 = 3<br>10 = 2<br>11 = 1 | All 4 raster pipes (16 pixels) can be enabled by software. |
| Maximum Geometry Pipes | 3:2 | Indicates the maximum number of vertex engines that can be used:<br>00 = 6<br>01 = 5<br>10 = 4<br>11 = 3 | All 6 geometry pipes can be enabled by software. |
| Enable Overclock Protection | 4 | Enables a circuit to switch the core clock frequency to the 66 MHz PCICLK when either the core or memory clock frequency is detected to be above the value set by the Maximum Core Clock or Maximum Memory Clock fuse settings. Each clock is monitored independently but only the core clock is throttled. | No overclock protection. |
| Mobile Disable | 5 | Disables Low Voltage Differential Signaling (LVDS). | LVDS can be enabled by software. |
| Workstation Disable | 6 | Clears bit 7 of the PCI revision ID to indicate to the driver that workstation features should not be used. There is also a WSDEGRADE board strapping option that can be used clear bit 7. | Bit 7 of the PCI Revision ID is set to '1' indicating that workstation features are enabled, unless WSDEGRADE board strapping option is set. |

FIG.3A

| Name | Range | Function | Default Behavior (no fuses cut) |
|---|---|---|---|
| Change ID | 8:7 | These device ID bits are OR'd with the ROM change ID bits. The ROM change ID bits come from external pins when no ROM is present. | Change ID bits come from ROM, or from external pins when no ROM is present. |
| Func Level | 11:9 | These three bits change the device ID. | Func level is '000', so is the first two characters of the PCI Device ID are '4A'. |

FIG.3B

| Name | Range | Function | Default Behavior (no fuses cut) |
|---|---|---|---|
| Defective pipes | 15:12 | Which pipes are defective: 0 = bit 0 | No pipes are marked as defective. |
| Max Memory Channels | 17:16 | 00 - 256-bit max<br>01 - 256-bit max<br>10 - 128-bit max<br>11 - 64-bit max | 256-bit memory interface. |
| Disable ROM Fuses | 18 | Don't let the ROM cut the fuses. The Change ID is still available via the ROM, or pin straps if no ROM is attached | ROM can cut fuses. |
| Disable Software Fuses | 19 | Don't let the software "cut" a fuse. | Software can cut fuses. |
| Maximum Core Clock | 23:20 | Only used if "Enable Overclock Detect" fuse is cut. In 16.67 MHz increments:<br>0000= 516MHz<br>...<br>1111 = 266MHz<br>Note that these frequencies are tied to being ratios of the PCICLK which is assumed to be 66MHz | N/A since Overclock Protection is disabled by default. |
| Maximum Memory Clock | 27:24 | Only used if "Enable Overclock Detect" fuse is cut. In 16.67MHz increments:<br>0000= 516MHz<br>...<br>1111 = 266MHz<br>Note that these frequencies are tied to being ratios of the PCICLK which is assumed to be 66MHz | N/A since Overclock Protection is disabled by default. |
| Internal revision ID | 31:28 | Internal Revision Number | Internal Revision ID is '0000'. |

SYSTEM AND METHOD FOR CONFIGURING AN INTEGRATED CIRCUIT

RELATED APPLICATIONS

This application claims the benefit of U.S. Patent Application Nos. 60/627,673 and 60/627,766, all filed Nov. 12, 2004. This application is also related to U.S. patent application Ser. No. 11/273,812, ("Controlling Clock Rates Using Configuration Information"), filed Nov. 14, 2005.

TECHNICAL FIELD

The disclosed embodiments relate to systems and methods for manufacturing integrated circuits.

BACKGROUND OF THE DISCLOSURE

Many integrated circuits (ICs) are alterable, or configurable, at various stages of manufacture to yield different variations of a basic IC. This is an efficient and economical manufacturing practice. One disadvantage of conventional manufacturing methods is that some ICs can be configured or reconfigured after manufacture by unauthorized persons. As a result the IC may be damaged, the IC may not function appropriately for its intended use, or other unintended and undesirable consequences may result. It is therefore desirable to be able to configure or reconfigure an IC at various stages of manufacture, or after manufacture, in a manner that is efficient, secure, and provides the maximum amount of configuration flexibility.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

DETAILED DESCRIPTION

Embodiments of the invention as described herein provide a solution to the problems of conventional methods as stated above. In the following description, various examples are given for illustration, but none are intended to be limiting. For example, an application specific integrated circuit (ASIC) with graphics processing capability is shown and discussed. However, the embodiments are equally applicable to any type of integrated circuit whose functionality it is desirable to configure at various points in a manufacturing process or product life-cycle.

Figure 1:
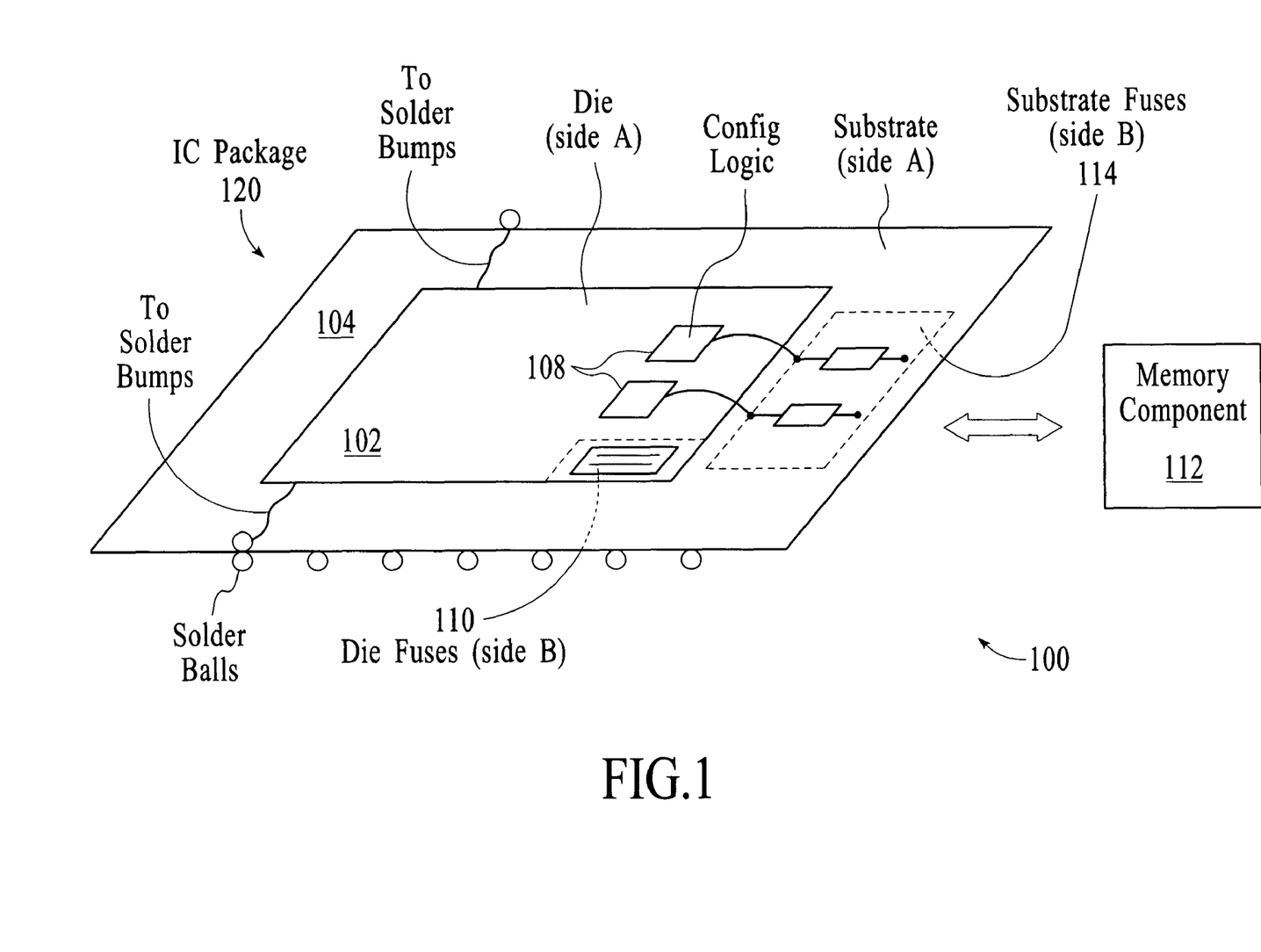
FIG. 1 is a block diagram of a system according to an embodiment.

Referring to FIG. 1, an embodiment of a system 100 is shown. The system 100 includes an IC package 120. The IC package 120 includes a die 102 and a substrate 104. The substrate 104 is effectively a circuit board with solder balls 106 on the bottom, and solder bumps (not shown) on the top (Side A). This is an example of a ball grid array package, but the invention is not so limited. The solder bumps attach the die 102 to the substrate 104. In conventional ICs, the solder bumps connect the die to pads on the substrate that include input/output (I/O) functionality. In embodiments of the invention, the IC package 120 further includes configuration logic cells 108 that also have I/O cell functionality. Configuration logic cells 108 are shown on the right of Side A of the die 102. Only two configuration cells 108 are shown for clarity. More than two configuration logic cells 108 are contemplated.

The configuration logic cells 108, instead of being connected to I/O pads, are connected to substrate fuses 114 on the underside (Side B) of the substrate 104.

The IC package 120 further includes die fuses 110 on Side B of the die 102. The die fuses 110 are extremely difficult to access after assembly of the die 102 on the substrate 104, making unintended or unauthorized alteration using these fuses after manufacture virtually impossible. The die fuses 110 are connected to the configuration logic cells 108. The connection is not shown for clarity.

Remote from the IC package 120 is a memory component 112, in one embodiment a Read Only Memory (ROM), that stores configuration data. As explained in more detail below, combination of the configuration data, the substrate fuses 114, and the die fuses 110 allows flexible, secure configuration of the IC package 120.

The term 'fuse' as used herein refers generically to a bit field which can be set or queried, which may include actual physical fuses present on the die 102 or substrate 104. In embodiments described herein, four types of fuses are defined. One type of fuse is referred to as a die fuse. Die fuses exist on the IC inside of a module referred to as a fuse box. The default state is for the fuse value to be pulled high. Alternatively, the value can be driven to low by using a laser to cut the connection to power before the packaging step. The term "cutting" a fuse is used herein to indicate setting a fuse to a certain value. In some instances, no physical cutting takes place. The terms "cut" and "set" are used interchangeably to indicate setting a value of a fuse to affect a certain associated configuration item, including a behavior, a function, or a mode of the IC 120.

In one embodiment, used as an illustration herein, the IC is an ASIC. Herein, the term ASIC is used interchangeably with the term IC, but the invention is not limited to ASICs.

Another type of fuse is referred to as a substrate fuse (as shown in FIG. 1, element 114). Substrate fuses function similarly to the die fuses (as shown in FIG. 1, element 110) except they exist on the bottom layer of the IC package substrate 104 and are set by a laser after the package assembly step.

Another type of fuse is referred to as a memory component fuse. In one embodiment, the memory component is a read only memory (ROM), but could alternatively be any other type of memory component. Memory component fuses are defined by values written in specified locations within the ROM image. More details are given below.

Yet another type of fuse is referred to as a software fuse. Software fuses are defined by values written into specific internal register bit fields by software. Using the software fuses, different setting of the other (die, substrate and memory component) fuses can be emulated, such that a configuration of the IC can be tested without actually setting or cutting the die fuses, the substrate fuses, and the memory component fuses. In various embodiments, software fuses are used only for debugging and should be disabled on production parts. One reason for disabling software fuses on production parts is to prevent unintentional or unauthorized modification of the IC after manufacture. More details are given below.

All of the fuses map into different functionalities of the ASIC. In one embodiment, the ASIC will function as specified by a value obtained from logically combining the values defined in each of the separate four fuses (die, substrate, ROM and software) for a particular function, as modified by any override settings. In one embodiment, the values defined in each of the four fuses are combined by logically ORing them together, but the invention is not so limited.

Figure 2:
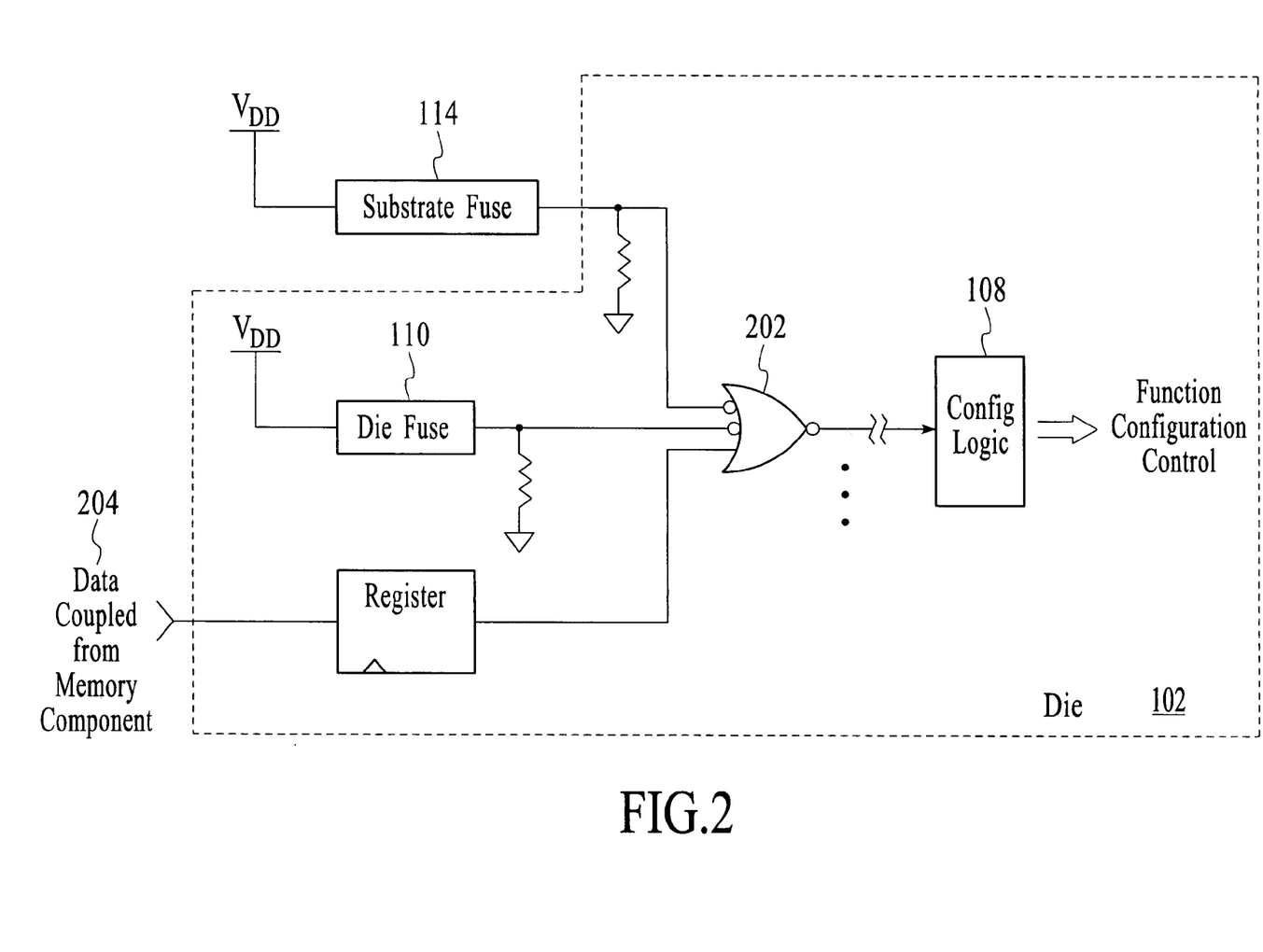
FIG. 2 is a block diagram of a die and function configuration logic circuitry according to an embodiment.

With reference to FIG. 2, logically combining fuses according to one embodiment is shown. The substrate fuse 114, the die fuse 110, and the ROM fuse ("data coupled from the memory component") 204 are shown. The three fuse values are ORed as shown, using OR gate 202, and the output is received by the configuration logic 108. The configuration logic 108, in turn, outputs function configuration control data to various components and registers on the IC.

In various embodiments, software can replicate the configuration value being used by the ASIC. The fuse values can each be read back separately. The die fuse 110 bits and the substrate fuse 114 bits read back a value of 1 in their default state and a value of 0 if they are cut. However when the four fuse values are ORed together to determine the final IC behavior, the die and substrate fuse values are first inverted.

Figure 3A:
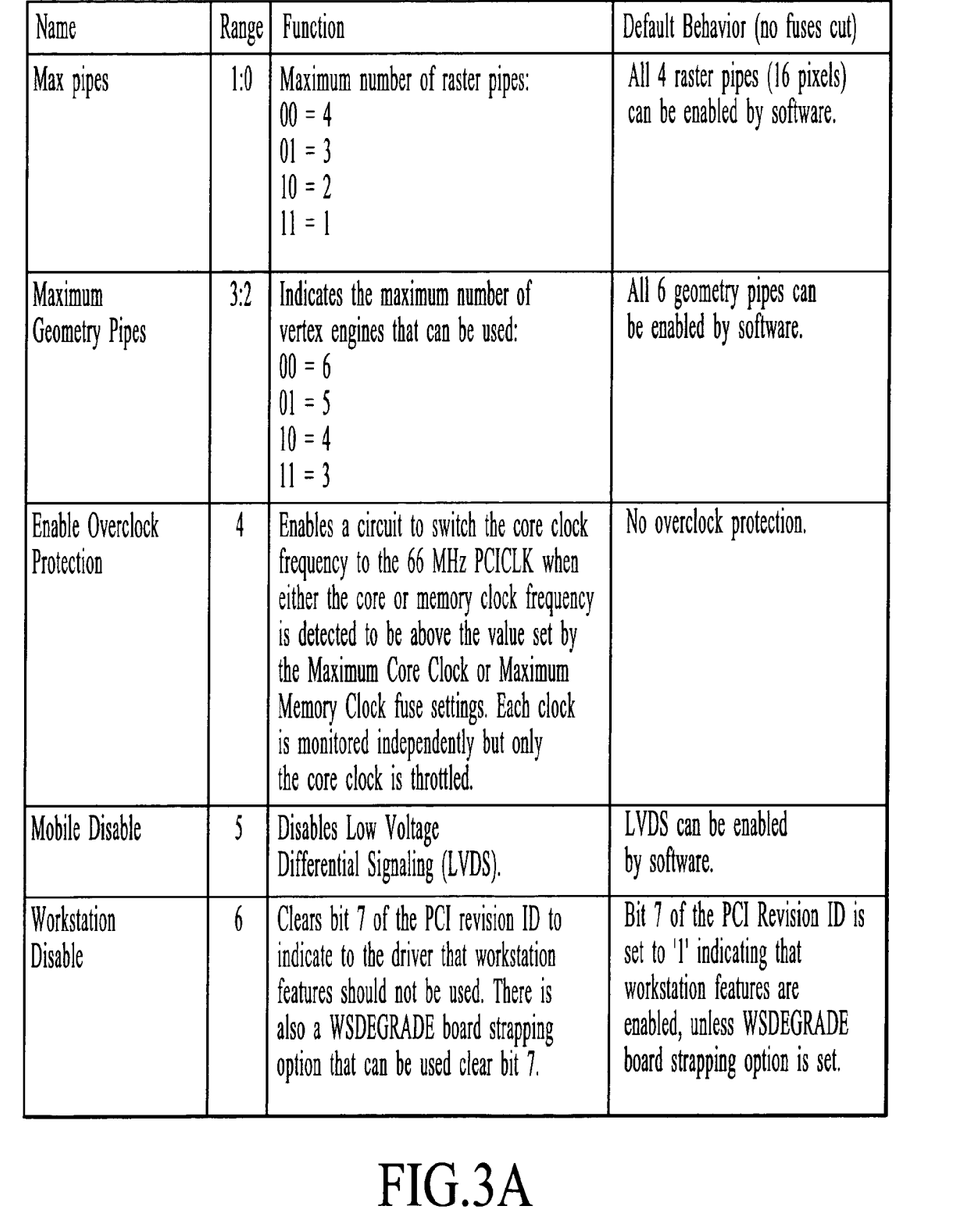
FIGS. 3A, 3B and 3C are diagrams of allocations of configuration bits according to an embodiment.
Figure 3B:
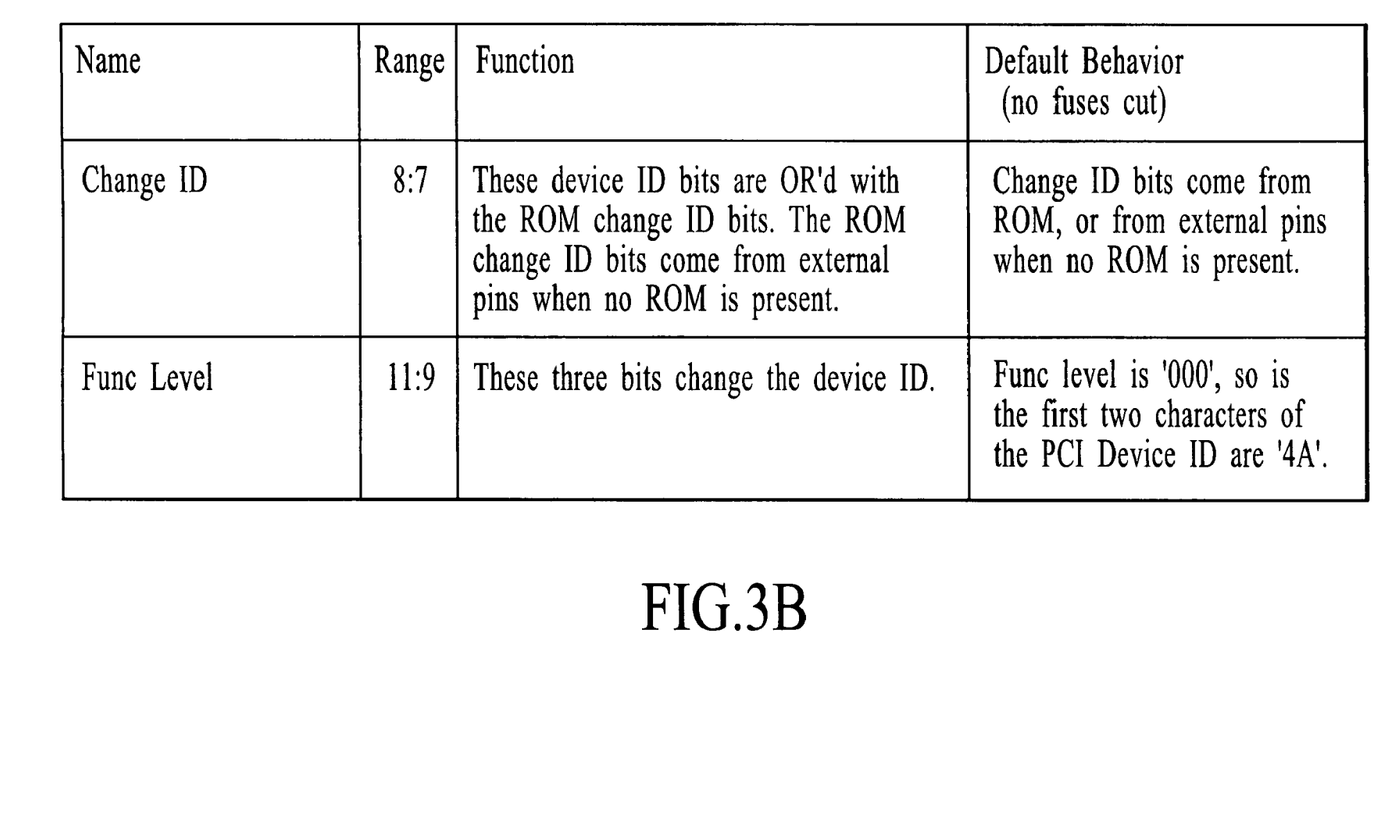
Figure 3C:
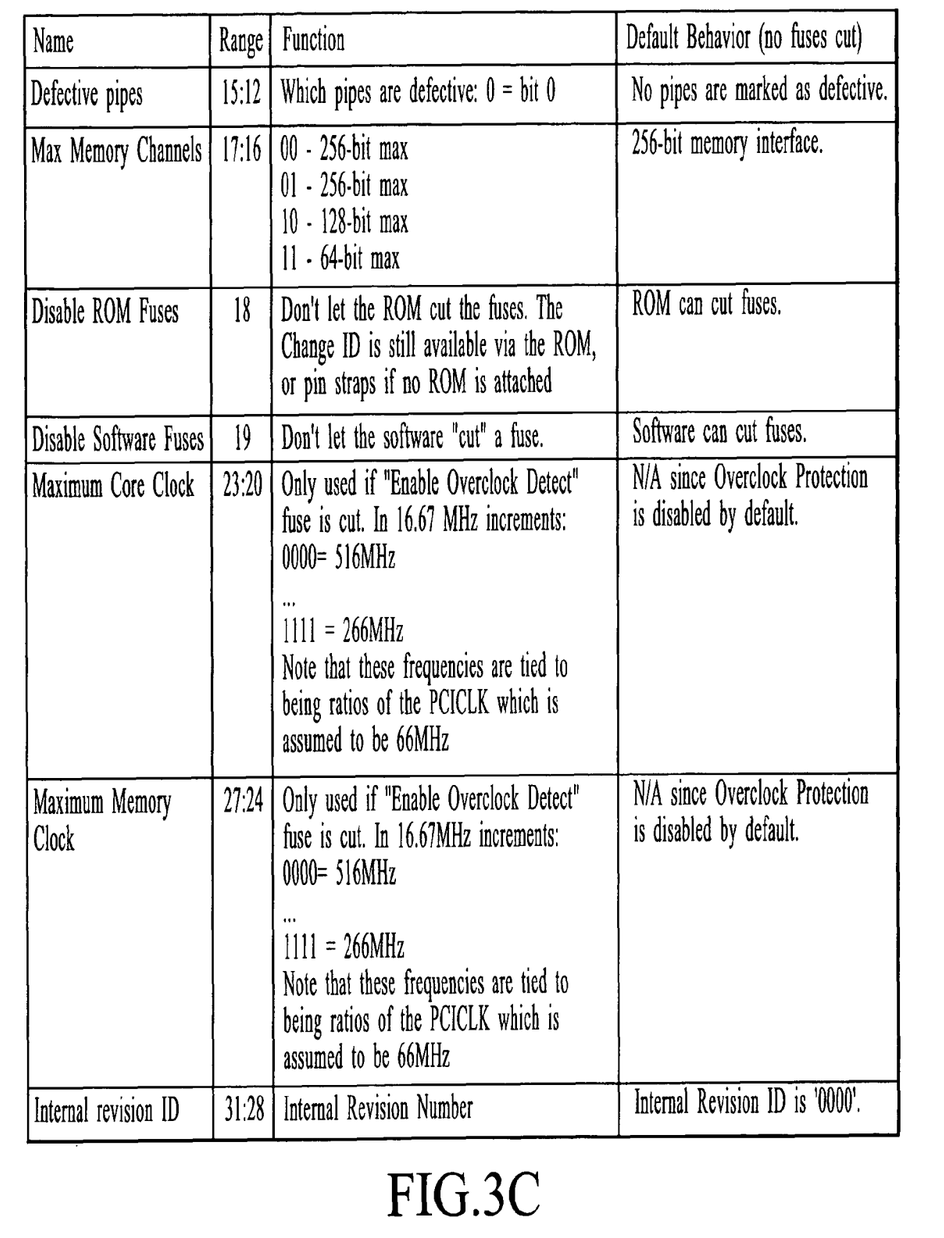

In one embodiment there are 32 configuration bits available for configuring the IC. In an embodiment, the 32 bits are allocated to 14 separate units that refer to specific configuration items that can include behaviors, functions or modes. One possible allocation of the 32 bits is shown in FIGS. 3A, 3B, and 3C. Many other allocations are possible.

FIG. 3A lists items that have associated or corresponding die, ROM and software fuses, and that also have corresponding substrate fuses. FIG. 3B lists items that have corresponding die, ROM and software fuses, and also have corresponding substrate fuses, and modify the device identification (ID) settings. FIG. 3C lists items that have corresponding die, ROM and software fuses, but do not have corresponding substrate fuses.

Referring to FIG. 3A, names of functions or modes are listed in the column titled "Name". A particular range of bits within the 32 bits, according to one embodiment, are listed in the column titled "Range". Functions or modes configured by the bits are listed in the column titled "Function". Default behaviors for the functions are listed in the column titled "Default Behavior". In one embodiment, the default behavior occurs when no fuses are cut. A "Max Pipes" function allows a maximum number of raster pipes to be made available for use in the IC. In one embodiment, the IC contains 4 raster pipes, but from one to three of the raster pipes can be made unavailable by configuring bits 1:0. In the default configuration all four raster pipe are enabled. Because a graphics ASIC is used as an example herein, hardware and/or software features and functions such as raster pipes and geometry pipes are mentioned. The embodiments are not limited to graphics processing or graphics ICs, however, but are equally applicable to any IC with different functionalities that can be variously configured.

A "Maximum Geometry Pipes" function indicates a number of vertex engines that are made available for use. In one embodiment, 3, 4, 5, or 6 vertex engines may be made available, but the invention is not so limited.

An "Enable Overclock Protection" function enables a circuit on the IC to switch the core clock frequency to slower clock when either the core clock or memory clock frequency is detected to be above a value set by Maximum Core Clock or Maximum Memory Clock fuse settings. In one embodiment, the slower clock is a 66 MHz Peripheral Component Interface clock (PCICLK). In an embodiment, each clock is monitored independently but only the core clock is controlled in this way, or "throttled". This function prevents an unauthorized person from altering the clock rate of the IC to exceed appropriate, safe rates. As a default configuration, no overclock protection is enabled.

A "Mobile Disable" function disables low voltage differential signaling (LVDS).

A "Workstation Disable" function changes a revision ID of the IC to indicate that workstation features should not be used. As a default configuration, workstation features are enabled.

FIG. 3B lists items that modify the device identification (ID) settings, have corresponding die, ROM and software fuses, and also have corresponding substrate fuses.

The "Change ID" function bits are ORed with "change ID" bits from the memory component, or ROM 112. When no ROM is present, the "change ID" bits come from external pins. The "Func Level" function changes the device ID of the IC device 120. As a default, the PCI device ID is set to a value of 4A, but this is just an example, and is not intended to be limiting.

FIG. 3C lists items that have corresponding die, ROM and software fuses, but do not have corresponding substrate fuses.

A "Defective Pipes" function allows pipes to be marked as defective. A "Max Memory Channels" function configures a maximum number of bits of memory channel for a memory interface between the IC and a memory component.

A "Disable ROM Fuses" function allows the IC to be configured so that the ROM cannot cut fuses.

A "Disable Software Fuses" function configures the IC so that fuses cannot be cut, or set, by software. Software fuses are typically disabled for production ICs because it is not desirable to provide the functionality to users. The software fuses are useful for debugging during the manufacturing and test process.

A "Maximum Core Clock" function allows a maximum core clock rate to be set in 16.67 MHz increments. This function is used when the Enable Overclock Protection function is enabled, and determines the clock rate, which when exceeded, causes the core clock to be switched to a lower frequency clock.

A "Maximum Memory Clock" function allows a maximum memory clock rate to be set in 16.67 MHz increments. This function is used when the Enable Overclock Protection function is enabled, and sets the clock rate, which when exceeded, causes the memory clock to be switched to a lower frequency clock.

An "Internal Revision ID" function allows the setting of an internal revision ID that has meaning for the manufacturer of the IC.

The fuse values can be read and/or written from and/or to any source or destination device. In one embodiment, the fuse values are read and/or written using the following 32 bit video input port (VIP) registers. The bit field decoding of each register follows the 'Range' column mapping of the tables illustrated in FIGS. 3A, 3B, and 3C.

CONFIG_DIE_FUSES—read values from die fuses

CONFIG_SUBSTRATE_FUSES—reads values from substrate fuses

CONFIG_ROM_FUSES—reads fuse values read from the ROM

CONFIG_REGISTER_FUSES—read and write software fuse values

In one embodiment, the ROM version of the fuses is read from bytes 7A (bits 7 through 0), 7B (15-8), 7C (23-16) and 7D (31-24) of the ROM.

In one embodiment, the software fuse values all default to being '0' unless overwritten.

In one embodiment, the die and substrate fuse values are read back in their native state when accessed through the above registers, but as previously mentioned, their values are inverted before being ORed with the ROM and software fuse values when determining the final hardware setting for the ASIC.

Because there are fuses on the IC, the IC can be built in some standard configuration that may include features and/or functionality not required or desired for all production versions of the IC. After many of the ICs are built, certain types or variations of the IC can be configured by laser cutting the fuses after testing to essentially yield different ICs. In addition, it can be determined which parts of the IC are working properly, and which are defective, and defective devices can be disabled.

In various embodiments, there is flexibility in the choice of methods to set fuse values for production. One method of many possible methods for setting fuse values for production is illustrated with reference to FIG. 4, FIG. 5, and FIG. 6.

Figure 4:
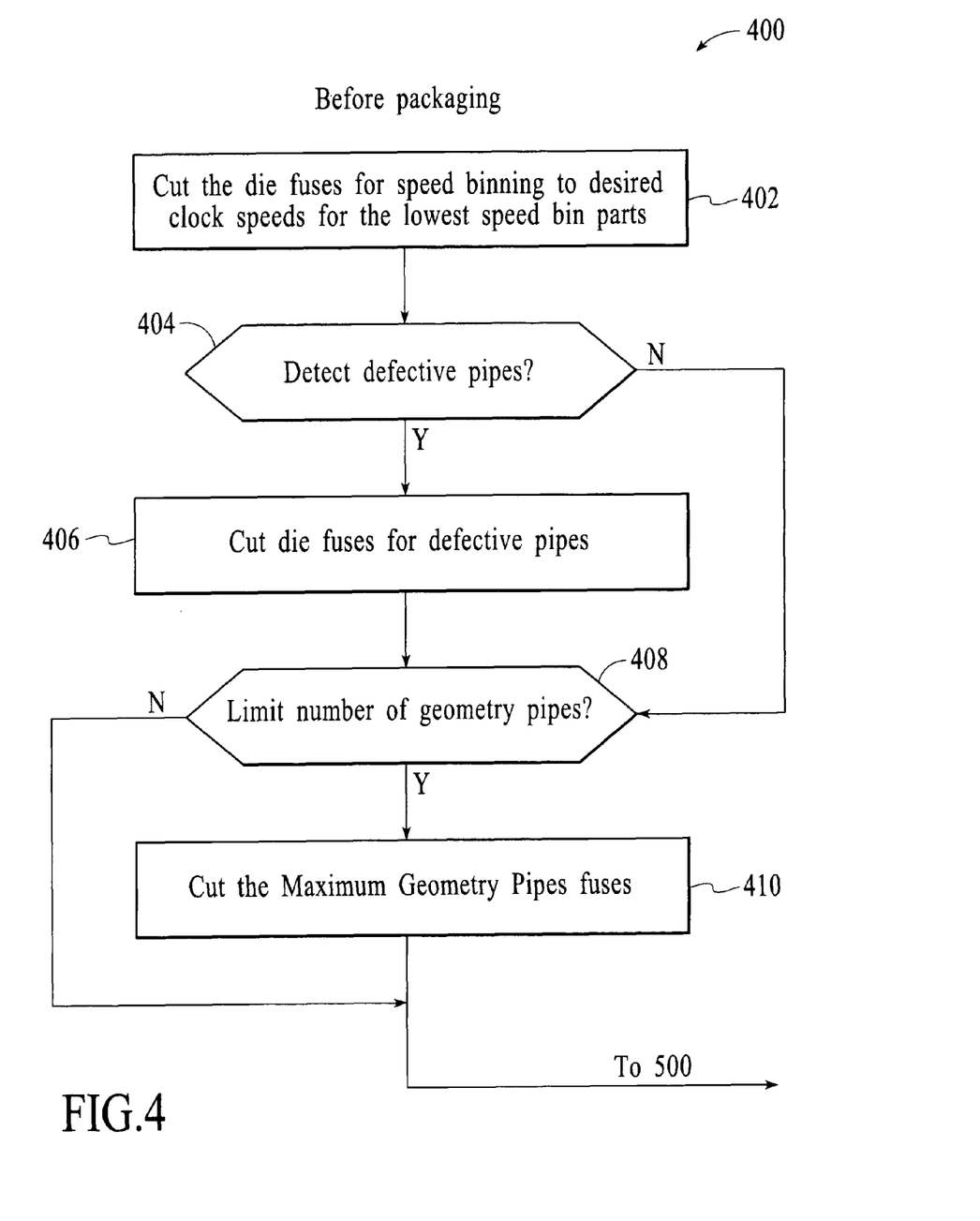
FIG. 4 is a flow diagram of a method of setting fuse values according to an embodiment.

With reference to FIG. 4, a method 400 is performed before packaging of group or lot of ICs that are being manufactured.

Figure 5:
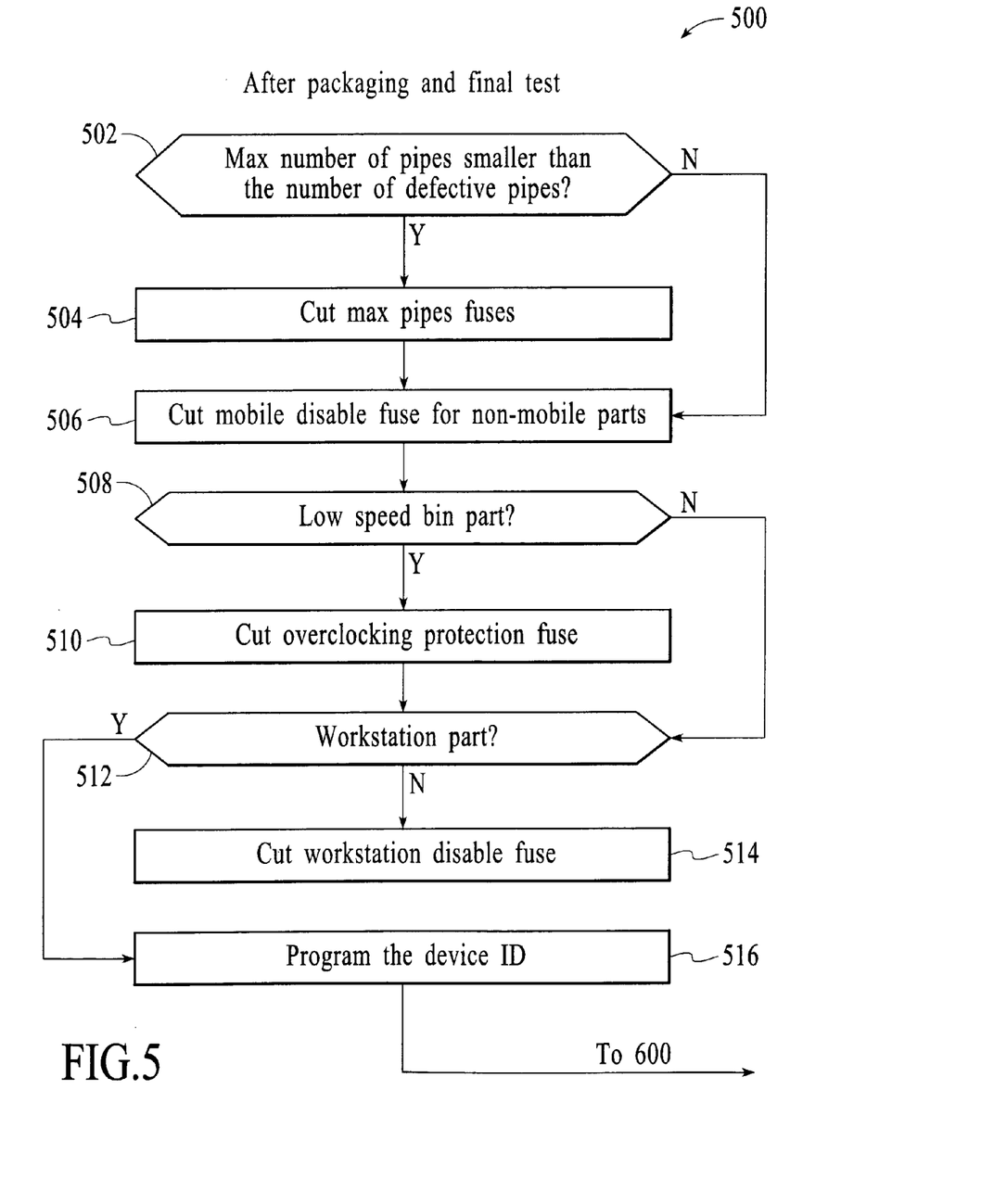
FIG. 5 is a flow diagram of a method of setting fuse values according to an embodiment.

At 402, die fuses of the ICs are cut for speed binning to desired clock speeds for the lowest speed bin parts. This could include different clock speeds for different clocks. At 404, it is determined whether there are any defective pipes. If there are defective pipes, the die fuses are cut for those pipes at 406, so that the defective pipes will not be enabled, or usable, or accessible for operation of the IC. If there no defective pipes, it is next determined at 408 whether the number of geometry pipes is to be limited for the ICs. If the number of geometry pipes is to be limited, the maximum geometry pipes fuses are cut at 410. After the maximum geometry pipes fuses are cut at 410, the process continues to an after packaging and final test method 500. The method 500 can also apply after at-speed automatic test equipment (ATE) testing, or after socket-based testing. If the number of geometry pipes is not to be limited, the process continues directly to the method 500.

Referring to FIG. 5, it is determined at 502 whether the maximum number of pipes is smaller than the number of defective pipes. If the maximum number of pipes is not smaller than the number of defective pipes, the mobile disable fuse is cut at 506 for ICs that are not intended for mobile devices. If the maximum number of pipes is smaller than the number of defective pipes, the max pipe fuses are cut at 504. Then the mobile disable fuse is cut at 506 for ICs that are not intended for mobile devices.

Figure 6:
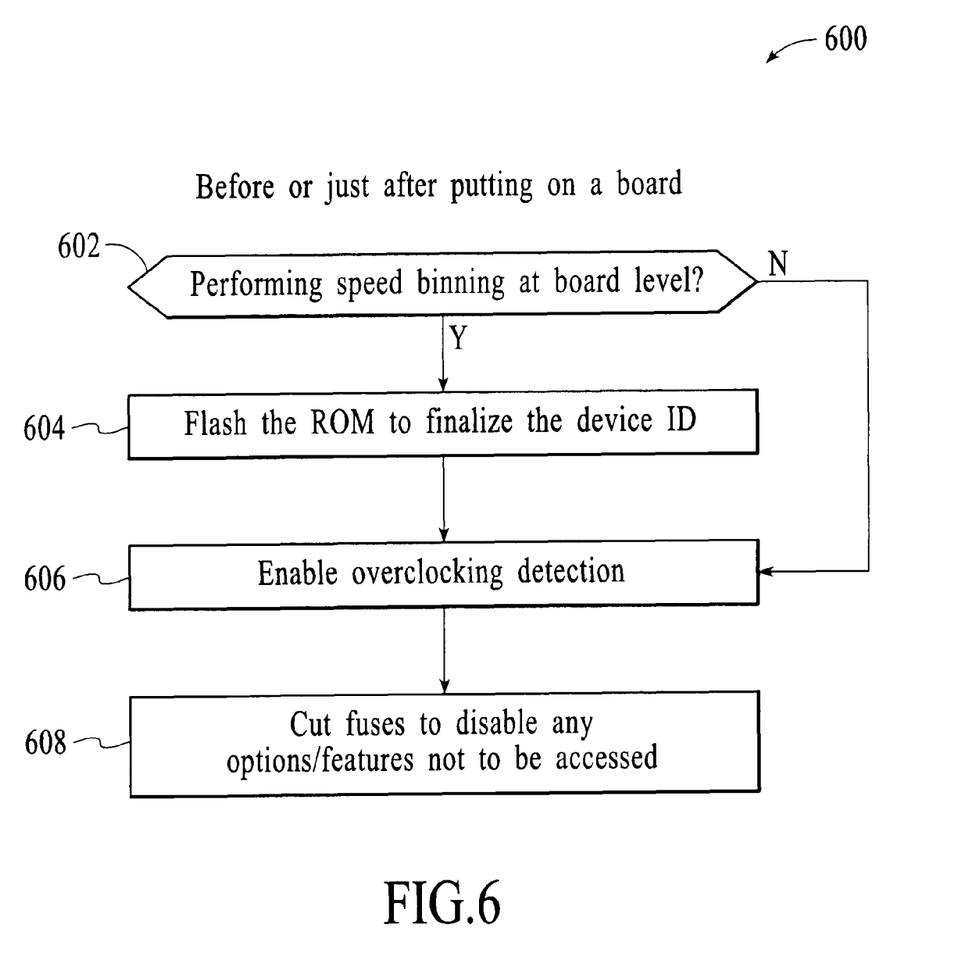
FIG. 6 is a flow diagram of a method of setting fuse values according to an embodiment.

If the IC is a not a low speed bin part, as determined at 508, it is next determined whether the IC is intended to be a workstation part at 512. If the IC is a low speed bin part, as determined at 508, the overclock protection fuse is cut at 510. Then it is determined whether the IC is intended to be a workstation part at 512. If the IC is a workstation part, the device ID is programmed at 516 and the process continues to method 600. If the IC is not a workstation part, the workstation disable fuse is cut at 514. Then the device ID is programmed at 516 and the process continues to method 600.

Alternatively, some bits of the device ID may be unprogrammed so that they can later be set, for example by the ROM.

Method 600 is performed, in one embodiment, just before placing the IC on a circuit board, or alternatively, after placing the IC on the circuit board. At 602 it is determined whether speed binning is to be performed at the circuit board level. If speed binning is not to be performed at the circuit board level, overclocking protection is enabled at 606. If speed binning is to be performed at the circuit board level, the device ID is finalized by flashing the ROM, in one embodiment, at 604. Then overclocking protection is enabled at 606. Access to any options or features or functionalities that are not to be subsequently accessed or modified is disabled by cutting the appropriate fuses at 608.

In one embodiment that includes graphics processing capability on an ASIC, it is particularly advantageous to use the previously described methods to change the number of graphics processing channels, or pipes, at a board level from a maximum number to some lesser number.

Figure 7:
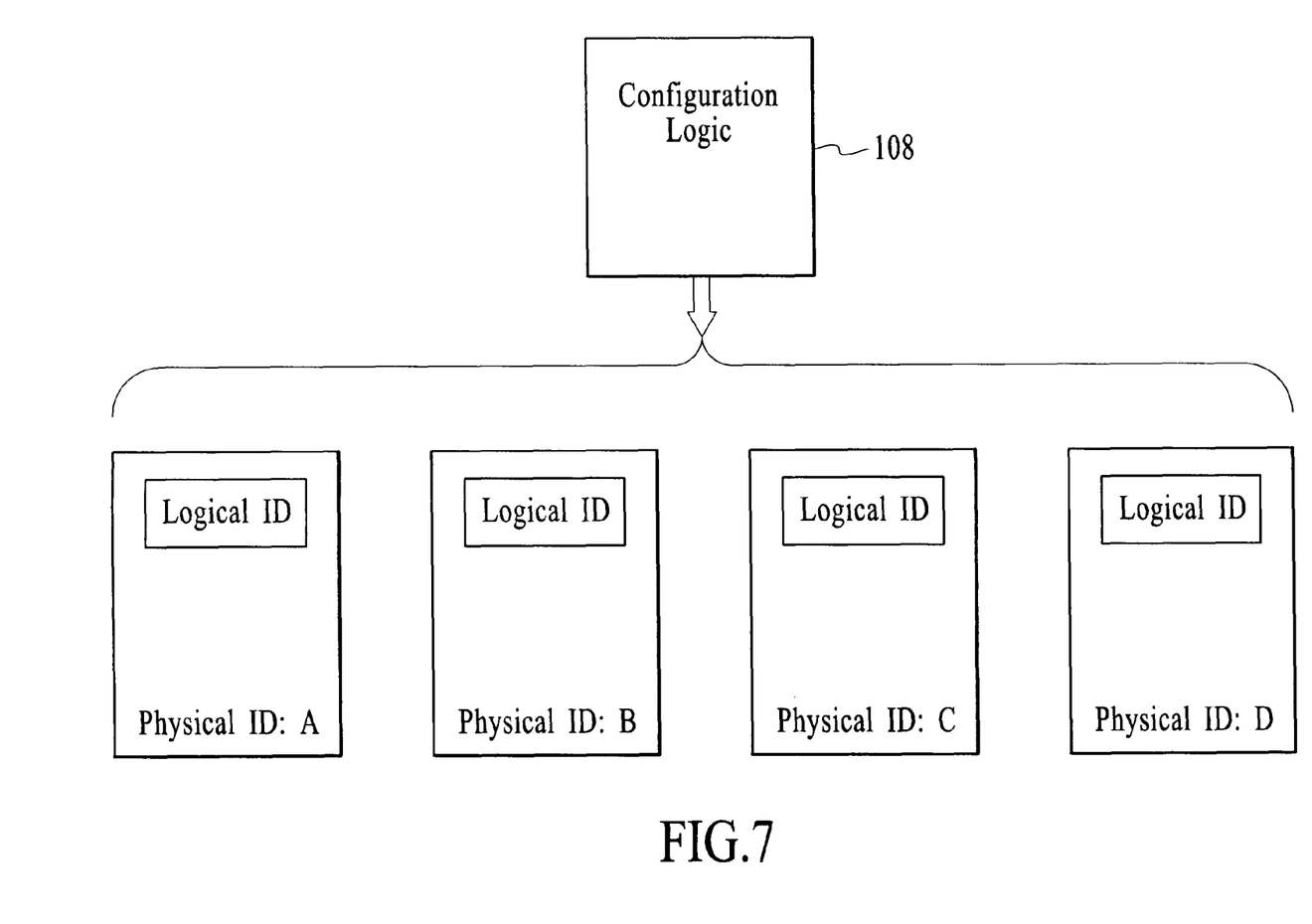
FIG. 7 is a block diagram of specific configurable components of an ASIC according to an embodiment.

Referring to FIG. 7, specific configurable components of one embodiment of an ASIC are shown. The configurable components are labeled with physical device identifications (IDs) A, B, C, and D. The physical device ID is permanently assigned. The configurable components are also labeled with logical device identifications IDs. The logical device IDs can be assigned variously. For example one assignment would be "0, 1, 2, 3", and another would be "3, 1, 0, 2". The logical device ID is received from the configuration logic and stored in a register on the device.

In one embodiment, the components are graphics processing channels, also referred to as graphics pipes, that are each similar in functionality. Each pipe can be given a portion of a screen or printed page to process. Typically, if more pipes are employed, it takes less time to draw the intended image. With configuration as described above, it can be determined at a later stage in manufacturing what kind of system the ASIC should embody. For example, it may be desirable to have a three-pipe system instead of a four-pipe system. In some instances, one of the pipes may be defective, and the system must be able to perform without the defective pipe. In other instances, it may be desirable to degrade the performance of the ASIC by using only three pipes.

Configuration of the pipes can occur according to at least two modes. One mode includes an automatic mechanism by which software directs the hardware to configure itself in the "best" way. This includes assuring that defective pipes are not used. This also includes assuring that the hardware behaves consistently (for example, in response to test stimuli) regardless of the relative assignment of logical device IDs.

In another configuration mode, software chooses the pipes it wants to use. This mode is not an automatic mechanism. Pipes can be disabled using this mode, but not later enabled. The unused pipes may be defective pipes, or just unwanted pipes.

Systems and methods of an embodiment for configuring an IC include a method for manufacturing an IC. The method of an embodiment comprises associating configuration items of the IC with at least one fuse, wherein the at least one fuse has a value, and wherein a fuse comprises a bit field and a physical fuse. The method of an embodiment comprises configuring the IC, comprising logically combining multiple fuse values to determine a particular configuration, wherein at least one of the fuse values is not alterable after manufacture of the IC.

The configuration items of an embodiment include behaviors, functions, and modes.

The at least one type of fuse of an embodiment comprises at least one type of fuse, the at least one type of fuse comprising a die fuse that is present on a die of the IC.

The die fuse of an embodiment is positioned on a surface of the die that contacts the substrate, and wherein the die fuse is settable to the value by laser cutting a connection between the fuse and a power source before the IC is packaged.

The at least one type of fuse of an embodiment comprises a substrate fuse that is present on a bottom layer of a substrate of the IC.

The substrate fuse of an embodiment is settable to the value by laser cutting after the IC is packaged.

The at least one type of fuse of an embodiment comprises a memory component fuse comprising values written in specified locations within a memory.

The memory of an embodiment comprises a read only memory (ROM).

The at least one type of fuse of an embodiment comprises a software fuse comprising values written in specific internal register bit fields by software.

The method of an embodiment comprises disabling the software fuse after manufacture to prevent subsequent alteration of configuration items associated with the software fuse.

The configuration items of an embodiment comprise a maximum number of a particular type of hardware resource enabled for use.

The configuration items of an embodiment comprise disabling of defective hardware resources that are not to be available for use.

The configuration items of an embodiment comprise a maximum clock speed for at least one IC clock.

The configuration items of an embodiment comprise enabling overclocking protection to enable detection of clock speeds exceeding the at least one maximum clock speed.

The method of an embodiment comprises setting a die fuse for speed binning to a desired clock speed of a lowest speed bin IC.

The method of an embodiment comprises setting a die fuse for at least one defective hardware resource.

The method of an embodiment comprises setting a die fuse for at least one hardware resource to be disabled, wherein the hardware resource is functional, but is unavailable.

The die fuses of an embodiment are set before packaging the IC.

The method of an embodiment comprises determining, for a particular hardware resource, whether a desired maximum number of the resources is smaller than a number of the resources that is defective.

The method of an embodiment comprises setting a fuse to determine a maximum number of the resources that are available if the desired maximum number of the resources is smaller than a number of the resources that is defective.

The method of an embodiment comprises setting a fuse to program a device identification for the IC.

Setting the fuses of an embodiment occurs after the IC is packaged and tested.

The method of an embodiment comprises setting at least one fuse to disable at least one configuration item that is not to be accessed after manufacture of the IC.

Systems and methods for configuring an IC include a system comprising an IC die comprising at least one configuration logic cell positioned on a first surface of the die, and a plurality of die fuses positioned on a second surface of the die. The system of an embodiment comprises an IC substrate comprising a first surface and a second surface, comprising a plurality of substrate fuses positioned on the second surface of the substrate, wherein the plurality of substrate fuses and the plurality of die fuses is coupled to the at least one configuration logic cell. The system of an embodiment comprises at least one memory component coupled to the at least one configuration logic cell, wherein the configuration logic is configured to receive a result of combining values from the plurality of die fuses, the plurality of substrate fuses, and the at least one memory component, and to output a function configuration control value to configure the IC.

The die and the substrate of an embodiment are configured to be assembled such that the second surface of the die is coupled to the first surface of the substrate, wherein the die fuses are not readily accessible after assembly.

The system of an embodiment comprises a plurality of memory component fuses comprising values written in specified locations within the memory component.

The die of an embodiment further comprises combinatorial logic for combining the values of the die fuses, the substrate fuses, and the memory component fuses and outputting a resultant value to the at least one configuration logic cell.

The system of an embodiment comprises a plurality of software fuses comprising values written in specific internal register bit fields of the IC, such that a configuration of the IC can be tested without setting the die fuses, the substrate fuses, and the memory component fuses.

The system of an embodiment comprises a plurality of at least one type of hardware resource, wherein configuring the IC comprises selectively disabling at least one of the plurality of the at least one type of hardware resource.

The system of an embodiment comprises at least one clock signal, wherein configuring the IC comprises setting a maximum speed for the at least one clock signal.

The system of an embodiment comprises an overclock protection circuit, wherein configuring the IC comprises enabling the overclock protection circuit such that a predetermined maximum clock speed is detected, and the clock speed is reduced in the detection.

Systems and methods for configuring an IC include an IC, comprising a die comprising at least one configuration logic cell positioned on a first surface of the die, and a plurality of die fuses positioned on a second surface of the die. The IC of an embodiment comprises a substrate comprising a first surface and a second surface, comprising a plurality of substrate fuses positioned on the second surface of the substrate, wherein the plurality of substrate fuses and the plurality of die fuses is coupled to the at least one configuration logic cell that outputs a function configuration control value that configures the IC, wherein values of the plurality of substrate fuses and the plurality of die fuses affect the configuration control value, and wherein the die and substrate are assemble such that some of the plurality of substrate fuses and the plurality of die fuses are inaccessible after the IC is assembled and packaged.

The IC of an embodiment comprises at least one memory component coupled to the at least one configuration logic cell, wherein the configuration logic is configured to receive a result of combining values from the plurality of die fuses, the plurality of substrate fuses, and the at least one memory component, and to output the function configuration control value.

The IC of an embodiment comprises a plurality of memory component fuses comprising values written in specified locations within the memory component.

The die of an embodiment comprises combinatorial logic for combining the values of the die fuses, the substrate fuses, and the memory component fuses and outputting a resultant value to the at least one configuration logic cell.

The IC of an embodiment comprises a plurality of software fuses comprising values written in specific internal register bit fields of the IC, such that a configuration of the IC can be tested without setting the die fuses, the substrate fuses, and the memory component fuses.

The IC of an embodiment comprises a plurality of at least one type of hardware resource, wherein configuring the IC comprises selectively disabling at least one of the plurality of the at least one type of hardware resource.

The IC of an embodiment comprises at least one clock signal, wherein configuring the IC comprises setting a maximum speed for the at least one clock signal.

The IC of an embodiment comprises an overclock protection circuit, wherein configuring the IC comprises enabling the overclock protection circuit such that a predetermined maximum clock speed is detected, and the clock speed is reduced in the detection.

Aspects of the invention described above may be implemented as functionality programmed into any of a variety of circuitry, including but not limited to programmable logic devices (PLDs), such as field programmable gate arrays (FPGAs), programmable array logic (PAL) devices, electrically programmable logic and memory devices and standard cell-based devices, as well as application specific integrated circuits (ASICs) and fully custom integrated circuits. Some other possibilities for implementing aspects of the invention include: microcontrollers with memory (such as electronically erasable programmable read only memory (EEPROM)), embedded microprocessors, firmware, software, etc. Furthermore, aspects of the invention may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies such as complementary metal-oxide semiconductor (CMOS), bipolar technologies such as emitter-coupled logic (ECL), polymer technologies (e.g., silicon-conjugated polymer and metal-conjugated polymer-metal structures), mixed analog and digital, etc.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number, respectively. Additionally, the words "herein," "hereunder," "above," "below," and words of similar import, when used in this application, refer to this application as a whole and not to any particular portions of this application. When the word "or" is used in reference to a list of two or more items, that word covers all of the following interpretations of the word: any of the items in the list, all of the items in the list, and any combination of the items in the list.

The above description of illustrated embodiments of the invention is not intended to be exhaustive or to limit the invention to the precise form disclosed. While specific embodiments of, and examples for, the invention are described herein for illustrative purposes, various equivalent modifications are possible within the scope of the invention, as those skilled in the relevant art will recognize. The teachings of the invention provided herein can be applied to other systems, not only for systems including graphics processing or video processing as described above.

The various operations described may be performed in a very wide variety of architectures and distributed differently than described. In addition, though many configurations are described herein, none are intended to be limiting or exclusive. The components described are examples of components that could embody the claimed invention. However, alternatives are within the scope of the claims.

In other embodiments, some or all of the hardware and software capability described herein may exist in a printer, a camera, television, a digital versatile disc (DVD) player, a handheld device, a mobile telephone or some other device. The elements and acts of the various embodiments described above can be combined to provide further embodiments. These and other changes can be made to the invention in light of the above detailed description.

In general, in the following claims, the terms used should not be construed to limit the system and method to the specific embodiments disclosed in the specification and the claims, but should be construed to include any processing systems and methods that operate under the claims. Accordingly, the system and method is not limited by the disclosure, but instead the scope of the system and method is to be determined entirely by the claims.

While certain aspects of the system and method are presented below in certain claim forms, the inventors contemplate the various aspects of the system and method in any number of claim forms. For example, while only one aspect of the system and method may be recited as embodied in a computer-readable medium, other aspects may likewise be embodied in a computer-readable medium. Accordingly, the inventors reserve the right to add additional claims after filing the application to pursue such additional claim forms for other aspects of the system and method for configuring an integrated circuit.

What is claimed is:

1. A method for manufacturing an integrated circuit (IC), the method comprising:
   providing a plurality of fuses on the IC, each of the plurality of fuses having an associated value;
   placing a configuration logic cell on the IC, the configuration logic cell being coupled to the plurality of fuses, wherein the configuration logic cell configures the IC based upon the values of the plurality of fuses;
   wherein the plurality of fuses includes at least one of:
      a physical die fuse present on a die of the IC, wherein the value of the die fuse is set to be unalterable by a process comprising laser cutting before packaging of the IC;
      a physical substrate fuse present on a substrate of the IC, wherein the value of the substrate fuse is set to be unalterable by a process comprising laser cutting before and after packaging of the IC;
      a memory component fuse comprising logic values stored in a memory location of the IC; and
      software fuses comprising logic values written to register bit fields in an internal register of the IC;
   logically combining, in the configuration logic, values of at least two of the fuses to configure the IC.

2. The method of claim 1, wherein the die fuse is fabricated on a surface of the die that contacts the substrate, and wherein the die fuse is not accessible after the IC is packaged.

3. The method of claim 1, wherein the memory comprises a read only memory (ROM).

4. The method of claim 1, further comprising disabling the software fuse after manufacture to prevent subsequent alteration of the software fuse.

5. The method of claim 1, further comprising:
   setting a die fuse for speed binning to a desired clock speed of a lowest speed bin IC;

setting a die fuse for at least one defective hardware resource; and setting a die fuse for at least one hardware resource to be disabled, wherein the hardware resource is functional, but is unavailable.

6. The method of claim 5, wherein the die fuses are set before packaging the IC.

7. The method of claim 1, further comprising:

determining, for a particular hardware resource, whether a desired maximum number of the resources is smaller than a number of the resources that is defective; and on a condition that the desired maximum number of the resources is smaller than a number of the resources that is defective, setting a fuse to determine a maximum number of the resources that are available; and setting a fuse to program a device identification for the IC.

8. The method of claim 7, wherein setting the fuses occurs after the IC is packaged and tested.

9. The method of claim 1, further comprising setting at least one fuse to disable at least one configuration item that is not to be accessed after manufacture of the IC.

* * * * *